United States Patent [19]

Dunkley et al.

[11] 3,776,786

[45] Dec. 4, 1973

[54] METHOD OF PRODUCING HIGH SPEED TRANSISTORS AND RESISTORS SIMULTANEOUSLY

[75] Inventors: James L. Dunkley; Bruce E. Smith, both of Scottsdale, Ariz.

[73] Assignee: Motorola, Inc., Franklin Park, Ill.

[22] Filed: Mar. 18, 1971

[21] Appl. No.: 125,648

[52] U.S. Cl. .................... 148/175, 29/578, 148/187, 317/235

[51] Int. Cl. ............................................ H01l 7/44

[58] Field of Search ............................ 148/175, 187; 317/235; 29/578

[56] References Cited

UNITED STATES PATENTS

| | | | |
|---|---|---|---|
| 3,560,278 | 2/1971 | Sanera | 148/187 |
| 3,449,643 | 6/1969 | Imaizumi | 317/235 |
| 3,309,246 | 3/1967 | Haenichen | 148/187 |
| 3,313,012 | 4/1967 | Long et al. | 148/187 X |
| 3,341,375 | 9/1967 | Hochberg et al. | 148/175 |
| 3,502,515 | 3/1970 | McMullen et al. | 148/175 |
| 3,581,165 | 5/1971 | Seelbach et al. | 317/235 |
| 3,281,915 | 11/1966 | Schramm | 148/187 X |

*Primary Examiner*—Hyland Bizot
*Assistant Examiner*—J. M. Davis
*Attorney*—Mueller & Aichele

[57] ABSTRACT

When transistors and resistors are provided on a chip or a wafer to become the electrical components of a digital or linear circuit, the emitter and collector regions must be etched simultaneously utilizing conventional photoresist techniques. In accordance with the prior art, the silicon dioxide layer over the area where the collector-contact is to be provided is substantially thicker than the silicon dioxide layer over the area where the emitter is to be provided, whereby the total time of etch must be great enough to etch the thicker silicon dioxide layer over the collector contacts, whereby the thinner layer is overetched, resulting in undercutting of the silicon dioxide layer in an unpredictable manner. The resulting emitters are larger in area than desired, resulting in a transistor having an emitter that is larger and therefore slower than is desired. A method of producing a transistor and a resistor on a chip is disclosed in which the thickness of the layers of silicon dioxide over the base and collector areas and over the resistor areas are more nearly equal prior to the emitter-collector photoresist operation, whereby overetching is greatly reduced when the holes are etched through the silicon dioxide layers in the production of the emitter and collector contacts. Furthermore, the silicon dioxide layer is grown, rather than being chemically deposited, since the grown silicon dioxide layer is denser, purer, and less likely to have pinholes therein than deposited silicon dioxide layers that have been used in the prior art.

8 Claims, 13 Drawing Figures

INVENTOR
James L. Dunkley
Bruce E. Smith
BY
Mueller & Aichele
ATTY'S

INVENTOR
James L. Dunkley
BY Bruce E. Smith

ATTY'S

INVENTOR
James L. Dunkley
Bruce E. Smith
BY
[signature]
ATTY'S

METHOD OF PRODUCING HIGH SPEED TRANSISTORS AND RESISTORS SIMULTANEOUSLY

BACKGROUND

In certain services, such as for instance in the emitter coupled logic circuits, the speed of the circuit is important. It is well known that a reduction of the thicknesses of the active base region of the transistors which are diffused into a chip will increase their speed by decreasing the transit time of the electrons in crossing the base. The speed of the transistors may be increased still further by decreasing the size of the transistor, emitter and base areas thereby decreasing the capacity thereof that must be charged and discharged in the operation of the transistor. In making such a small transistor, the emitter area as well as the collector and base preohmics must be small.

When resistors are applied to the chip, the material of the resistors and of the base or base enhancement regions are often of the same conductivity type, so that it is convenient to diffuse the base or base enhancement areas and the resistor into the chip at the same time. However, in accordance with the prior art, the silicon dioxide layer over the collector area is substantially thicker than it is over the base and resistor area. Therefore, when holes are etched for the emitter areas, a sufficient etching time is not provided for etching of the holes in the collector contact areas, and by the time the holes are etched through the region forming the collector-contact area, overetching or undercutting of the holes for the emitter occurs resulting in enlarged areas of the completed emitters which in turn results in emitters which are enlarged in an unpredictable manner, which in turn result in slower transistors.

Method of preventing this overetching are unsatisfactory. For example, one method involves etching off all the silicon dioxide from the wafer after base and resistor diffusions and depositing a substantially uniform layer of silicon dioxide on the surface of the wafer and etching through the deposited oxide layer to provide holes for diffusion of the emitter and collector areas. However, the cleaning off the silicon dioxide from the wafer results in an exposed surface of the wafer which may become contaminated, and furthermore, the uniform layer of silicon dioxide, which is usually produced by chemical deposition, may itself be contaminated and furthermore it is not as dense as or as free from pinholes as a thermally grown silicon dioxide layer. Therefore, using the known method to avoid overetching may result in undesired current paths (channeling) between the transistor elements, due to the inclusion of these impurities. Another method of avoiding overetching involves applying a thin coating of silicon nitride and putting the silicon dioxide layer over the silicon nitride. The silicon nitride is resistant to the etch for silicon dioxide, whereby the etch through the silicon dioxide layer for the deep holes is completed befoe a substantial amount of overetching occurs for the shallow holes in the silicon dioxide. The uniform layer of silicon nitride is then etched so that diffusion therethrough into the wafer takes place. However, this method requires the deposition of a thin layer of silicon nitride over the wafer.

It is an object of this invention to provide an improved method of producing transistors and resistors on a substrate.

It is another object of this invention to provide a method of utilizing the existing thermally grown silicon dioxide over the base areas and over the resistor areas of a wafer without etching off all silicon dioxide from the surface of the wafer, at the same time providing a thermally grown silicon dioxide layer being of nearly uniform thickness.

It is a still further object of this invention to provide a method of preventing overetching of the emitter while producing transistors and resistors in a substrate.

SUMMARY

In accordance with the method of this invention, a large hole is etched through the silicon dioxide layer (hereinafter $SiO_2$) over the area where the collector and base will be and at the same time a large hole is made in the $SiO_2$ layer over the area where the resistor is to be, then these holes are filled with thermally grown $SiO_2$, then a hole is cut through the thermally grown $SiO_2$ at the region where the base is to be and the base area is diffused into the wafer, during which process a $SiO_2$ layer grows over the base area and the $SiO_2$ layer over the resistance area becomes slightly thicker. Base enhancement holes are then cut into the $SiO_2$ layer over the base contact area and also in the $SiO_2$ layer over the resistance area. Since the layer over the base area is not greatly thinner than the layer over the resistance area, the etching time is not so different that there is substantial overetching. Then the base enhancements and resistors are simultaneously diffused into the exposed wafer through the several holes. It is noted that no nitride layer is used, no deposited $SiO_2$ layer is used, and the thickness of the $SiO_2$ layer over the base area and over the resistor and collector areas are nearly the same. Furthermore, the $SiO_2$ layers over the base enhancement regions and over the resistance area that grow when the base enhancement and the resistors are diffused into the substrate are almost identical in thickness so that when etching preohmic holes therethrough in later steps of providing metallic connections to the appropriate device areas, overetching will not result. When the emitter and collector-contact areas are etched subsequent to the simultaneous resistor and base enhancement diffusions, the oxide over the area where the holes are to be etched, in which the emitter and collector-contact diffusions are to be made, are etched through an almost uniform oxide thickness reducing any overetching that would occur on the emitter.

DESCRIPTION

The invention will be better understood upon reading the following description in connection with the accompanying drawing in which.

Figure 1:
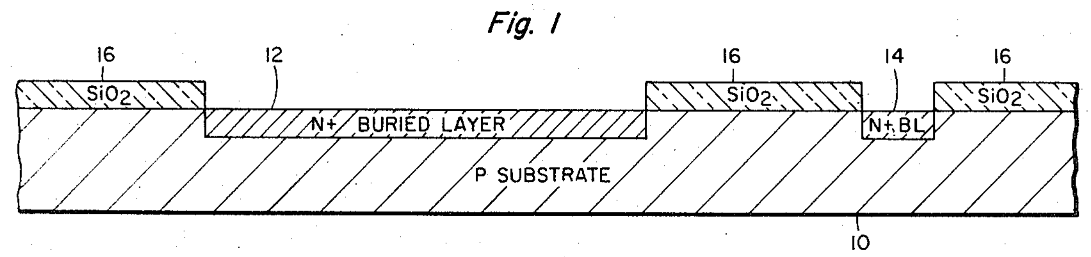
FIGS. 1–2 and 11–13 illustrate a prior art method.

Turning first to FIG. 1, a substrate 10 of P-type semiconductor material is provided and buried layers 12 and 14 of N+ material are diffused into the substrate through holes in a $SiO_2$ layer 16 in a well known manner. Then turning to FIG. 2, the layer 16 is cleaned off the substrate 10 and an N- epitaxial layer 18 is grown on top of the substrate 10. The P+ isolation diffusion 20 and deep collector diffusion 22 are provided which extend through the epitaxial layer 18. The N+ material 22 which is diffused with the isolation diffusion is deep enough to electrically contact the N+ buried layer 12 which is provided in the epitaxial layer 18 in a known manner. Also, as shown in FIG. 2, a layer 24 of $SiO_2$ is chemically deposited on top of the epitaxial layer 18.

Figure 2:
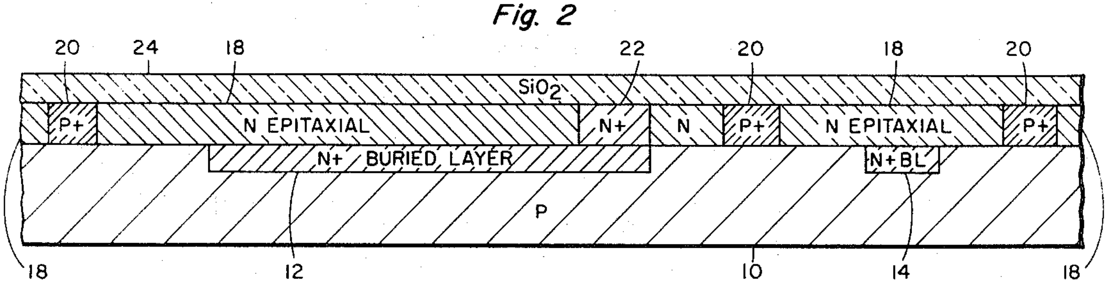
Figure 11:
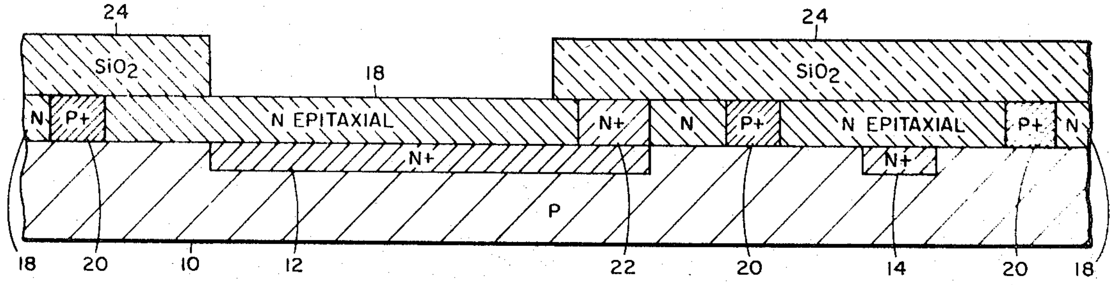
Figure 12:
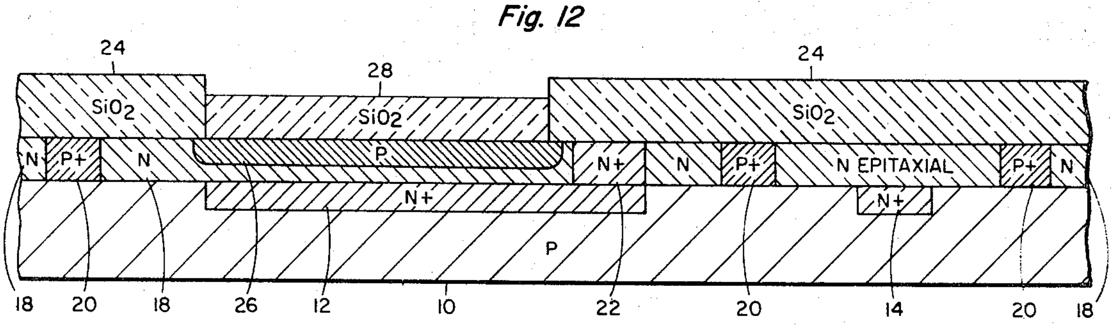

The method steps illustrated in FIGS. 1 and 2 are common to the prior art and to the presently disclosed invention. Continuing with the prior art, as shown in FIG. 11, a hole is made in the layer 24 as shown so that the P-type base material can be diffused into the N-epitaxial material 18 for about half of the thickness of the epitaxial layer. Then, as shown in FIG. 12, the P-type base material 26 is diffused through the hole in the layer 24. In the process of diffusing of this base material 26, the $SiO_2$ layer 24 becomes thicker and and a $SiO_2$ layer 28 grows in the hole in the layer 24. It will be noted that the $SiO_2$ layer 24 is more than twice as thick as the $SiO_2$ layer 28.

Figure 13:
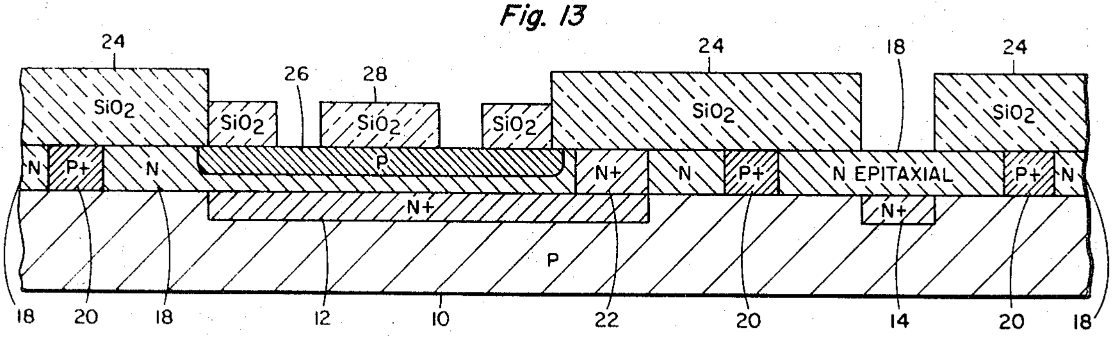

To increase the frequency of the transistor to be constructed, the base resistance must be decreased. This is accomplished by providing base enhancement regions in the base region 26. This is done by making holes as shown in FIG. 13 in the $SiO_2$ layer 28 and diffusing so much P-type impurities into the base region under the holes as to make the region under the holes P+. Since a resistor of P+ material will be provided in the region of the buried layer 14 but separated from the buried layer 14 by about half the thickness of the substrate 18, it is convenient when the base enhancement regions are provided, to provide the resistor. Therefore a hole is etched in the layer 24 at the region of the buried layer 14. However, as noted above, the $SiO_2$ layer 24 is much thicker than the $SiO_2$ layer 28, whereby overetching occurs in the holes in the layer 28 and the base enhancement regions become too large in an upredictable manner. The buried layer 12 and the N+ material 22 will provide a collector contact for a transistor as will be explained. It will be noticed that the layer 24 over the deep collector diffusion 22 is also much thicker than the layer 28 through the middle of which a hole must be etched to provide the emitter diffusion. Therefore when the collector preohmic hole and the emitter diffusion hole are simultaneously etched, overetching of the emitter will take place. The buried layer 14 will prevent current flow in the resistor (not shown in FIGS. 1, 2 and 11–13) from inducing current flow in the P substrate 10. The known methods of preventing this overetching, these methods being mentioned above, are not satisfactory for the reasons above stated.

Figure 3:
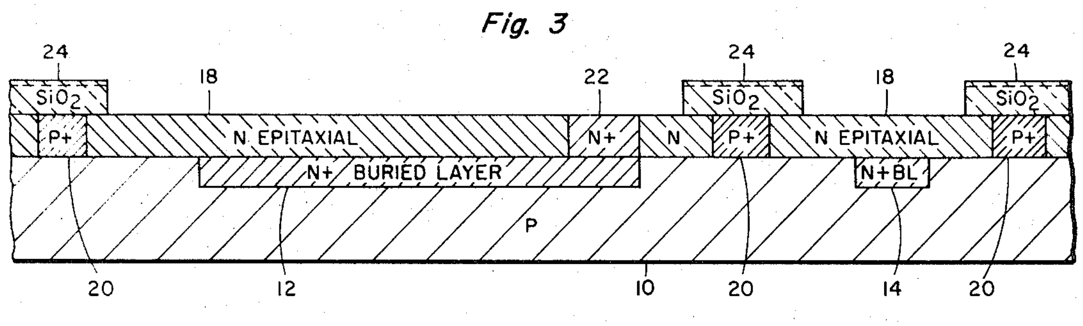
FIGS. 3–10 illustrate the method of the present invention.
Figure 4:
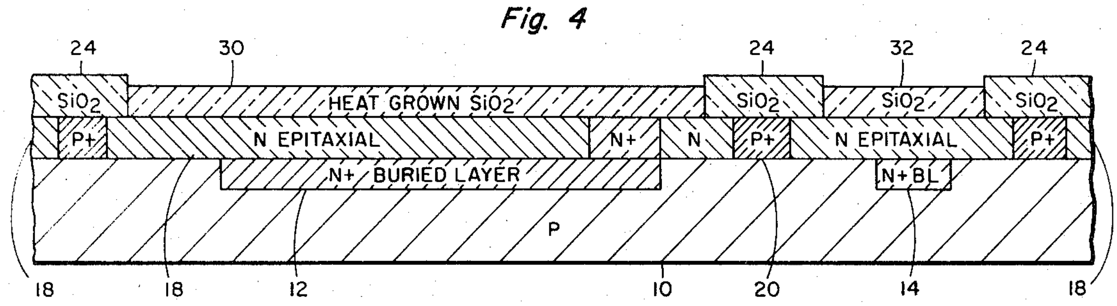
Figure 5:
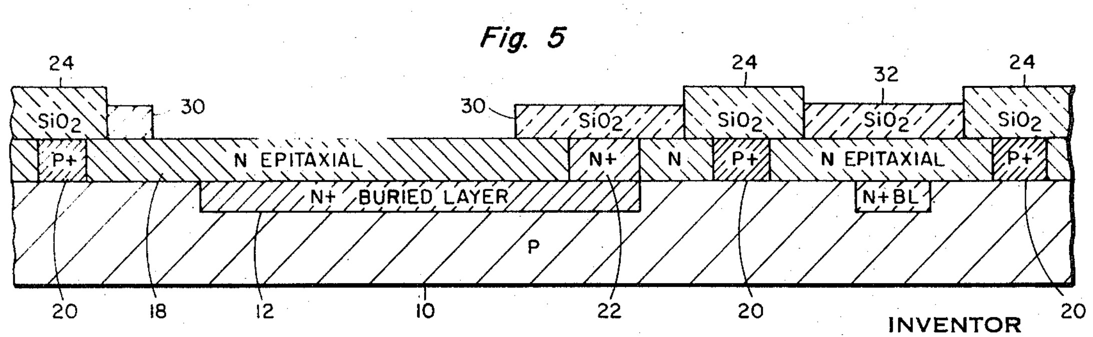
Figure 6:
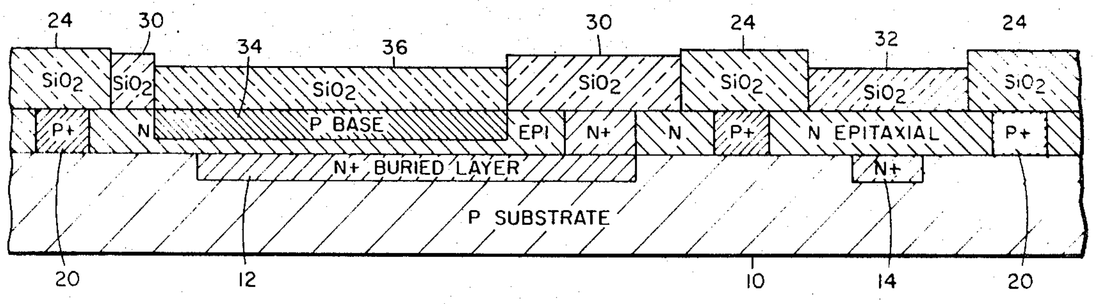
Figure 10:
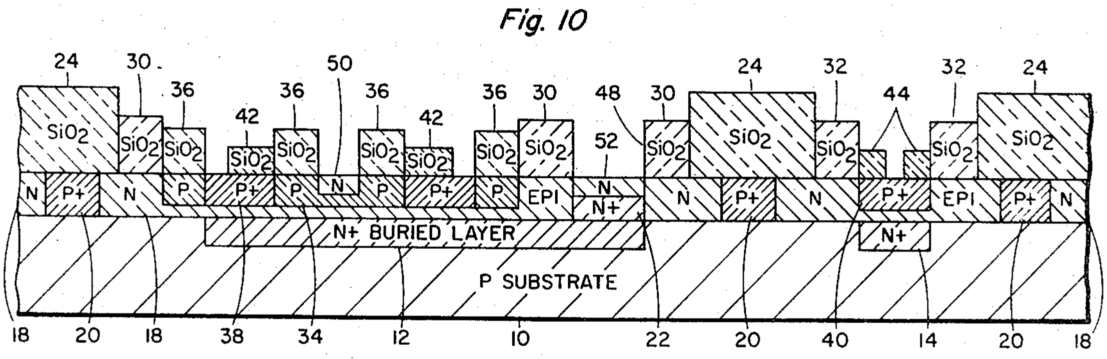

In accordance with this invention, after the common step illustrated in FIGS. 1 and 2, the step of FIG. 3 is performed, which comprises cutting away the $SiO_2$ layer 24 over both the buried layer 12 and the N+ material 22 as shown and also over the buried layer 14, also as shown in FIG. 3, and heat grown $SiO_2$ layers 30 and 32 are provided in the holes in layer 24 as shown in FIG. 4. It will be noted that the layer 24 becomes thicker during the growing of the layers 30 and 32 as indicated by the dotted line therethrough, but that the layers 30 and 32 are very nearly of the same thickness. In a later step it is advantageous to have the layer 24 quite thick since the conductors run over the layer 24 and the capacity of the conductors (not shown) to the substrate 18 is reduced due to this thickness of the $SiO_2$ layer 24. Then a hole is cut in the layer 30 as shown in FIG. 5 and as shown in FIG. 6, a P base material 34 is diffused into the substrate 18 to about half its thickness. A $SiO_2$ layer 36 will be formed in the hole in the $SiO_2$ layer 30 and the layer 32 will become thicker, but the thickness of the layers 36 and 32 will be more nearly the same than if the method of FIGS. 10–12 are used, in which as noted above, the thickness of the layer 24 is much thicker than the layer 28.

Figure 7:
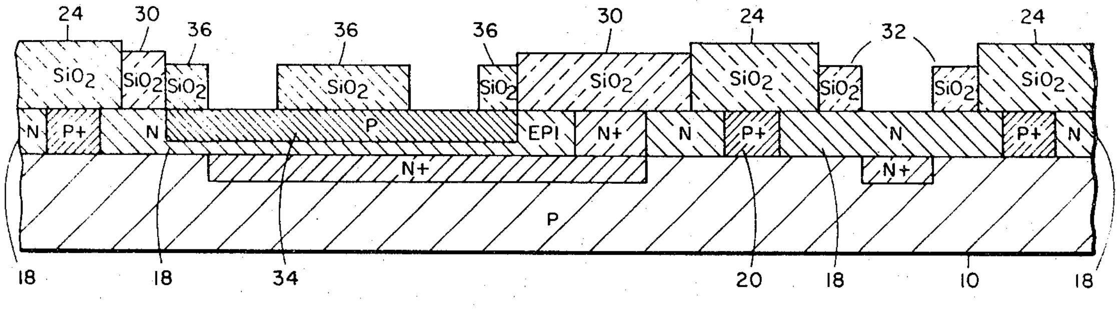
Figure 8:
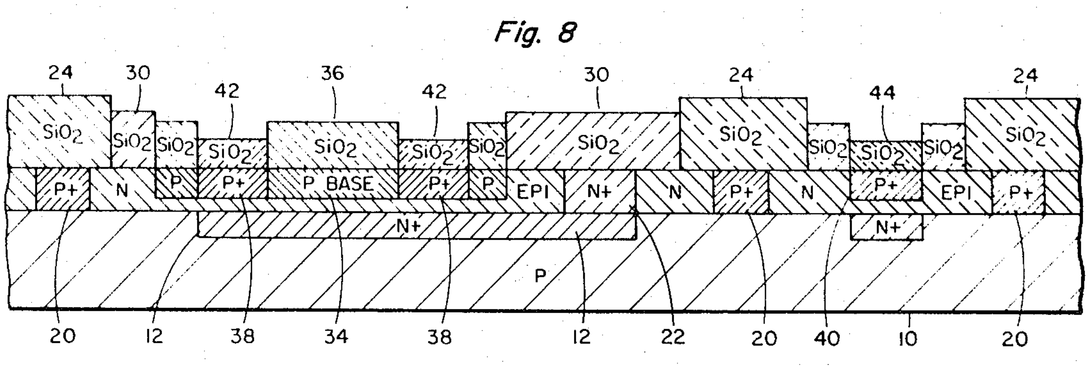

Then, turning to FIG. 7, holes are made in the layers 36 and 32 as shown. Since as noted, the thicknesses of layers 36 and 32 are nearly the same, the overetching of the prior art does not occur to any substantial extent and need not be guarded against. Then, as shown in FIG. 8, P+ base enhancement area 38 are diffused into the epitaxial layer 18 through the holes in the layer 36 and a P+ area 40, which is to be a resistor, is diffused into the epitaxial layer 18 through the hole in the layer 32 simultaneously therewith. Layers 42 of $SiO_2$ will be formed over the base enhancement areas 38 and a layer 44 of $SiO_2$ will be formed over the resistor 40 and, it will be noted, the $SiO_2$ layers 42, 42 and 44 are of the same thickness.

Figure 9:
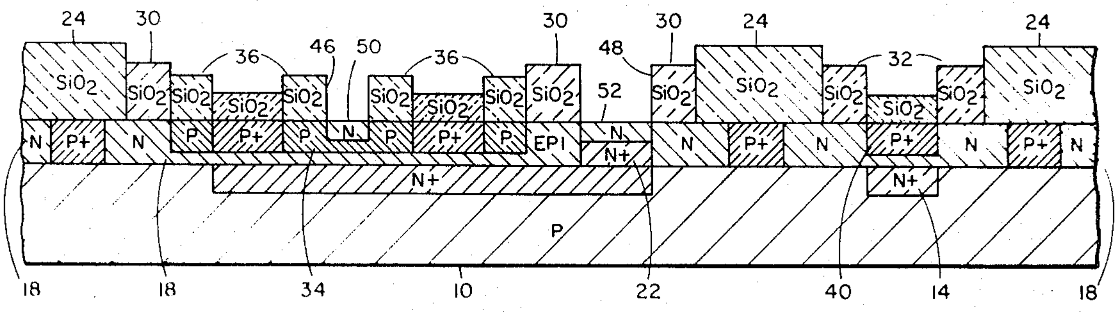

Turning to FIG. 9, the middle portion of the $SiO_2$ layer 36 is cut away as shown as 46 and the middle portion of the layer 30 is cut away as shown at 48. While the thickness of the layer 30 is greater than the thickness of the layer 36, the difference in thickness is not so great as to cause unacceptable overetching in the area where the emitter 50 is to be provided. The the N-type emitter 50 is formed and the top of the N+ region 22 is enhanced by a diffusion of N-type material in the holes 46 and 48, care being taken to limit the oxygen in the diffusion gas so that the further growth of the several $SiO_2$ layers is very small, such as a few hundred angstrom units in depth. Therefore, the $SiO_2$ layer in the holes 46 and 48 is so thin that it will wash away using a dilute buffered HF acid wash leaving a base emitter area and a bare enhanced collector connector area 52. Then, also as shown in FIG. 10, holes are etched into the $SiO_2$ layers 42, 42 and 44, it being noted that these layers are all of the same thickness whereby no overetching can result, and connections which are usually of aluminum can be made to the collector, base and emitter of the resulting transistor and to the resistor 40 through the holes, also called preohmics, leading thereto.

What is claimed is:

1. A method for producing a transistor in a body of semiconductor, the body of semiconductor including a substrate of a first conductivity type, a buried layer of a second conductivity type, an epitaxial layer of the second conductivity type including a first epitaxial region of the second conductivity type on the substrate and the buried layer, and an isolation region of the first conductivity type isolating the first epitaxial region, and also including base and emitter regions comprising the steps of:

removing any oxide from the surface of said epitaxial layer;

forming a first masking layer on said epitaxial layer;

etching a first opening in said first masking layer, exposing a first area of said first epitaxial region;

forming a second masking layer on said first area of said first epitaxial region, said second masking layer being substantially thinner than said first masking layer;

etching a second opening in said second insulating layer exposing a second area of said first epitaxial region prior to diffusion of a base region, said second area being smaller than and within said first area;

forming a base region of said first conductivity type in said first epitaxial region essentially coextensive with said second opening by passing impurities of said first conductivity type through said second opening into said first epitaxial region;

forming a third masking layer on said second area;

etching a third opening in said third masking layer, exposing a third area in said base region, and concurrently etching a fourth opening in said second masking layer exposing a fourth area of said first epitaxial region, said fourth area being outside of said base region; and concurrently forming an emitter region is said base region and a collector contact region in said first epitaxial region by passing impurities of said second conductivity type through said third and fourth openings, respectively, and to said first epitaxial region.

2. The method as recited in claim 1 including the steps of etching a fifth opening in said third masking layer exposing a fifth area within said base prior to step (c), and then forming a heavily doped base contact region by passing impurities of said first conductivity type through said fifth opening.

3. The method as recited in claim 2 wherein said epitaxial layer includes a second epitaxial region isolated from said first epitaxial region isolated from said first epitaxial region by said isolation region.

4. The method as recited in claim 3 wherein a sixth opening is etched in said first masking layer concurrently with the etching of said first opening, exposing a sixth area of said second epitaxial region, and wherein said second masking layer covers said sixth area.

5. The method as recited in claim 4 wherein step (c) further includes etching a seventh opening in said second masking layer, exposing a seventh area within said sixth area concurrently with the etching of said third and fourth openings.

6. The method as recited in claim 5 wherein said first conductivity type is p-type and said second conductivity type is n-type.

7. The method as recited in claim 1 wherein said second, third and fourth masking layers are thermally grown silicon dioxide.

8. The method as recited in claim 1 wherein said body of semiconductor includes a heavily doped region of said second conductivity type extending from said buried layer through said first epitaxial region to said fourth area of said first epitaxial region, forming a low resistance path from said fourth area to said buried layer.

* * * * *